(12) United States Patent
Chen

(10) Patent No.: US 6,625,041 B1
(45) Date of Patent: Sep. 23, 2003

(54) EXPANSION CARD FIXTURE

(75) Inventor: Sheng-Chung Chen, Ping-Tung Hsien (TW)

(73) Assignee: Accton Technology Corporation, Hsinchu (TW)

( * ) Notice: Subject to any disclaimer, the term of this patent is extended or adjusted under 35 U.S.C. 154(b) by 0 days.

(21) Appl. No.: 10/350,815

(22) Filed: Jan. 24, 2003

(51) Int. Cl.[7] .................................................. H02B 1/01
(52) U.S. Cl. .................. 361/829; 361/801; 361/685; 24/295; 24/293; 248/103; 248/200
(58) Field of Search .................................. 361/829, 707, 361/801, 807, 740, 747, 685; 24/295, 293; 248/346.03, 500, 680, 103, 200

(56) References Cited

U.S. PATENT DOCUMENTS

| | | | | |
|---|---|---|---|---|
| 5,890,693 A | * | 4/1999 | Do et al. | 248/346.03 |
| 5,936,835 A | * | 8/1999 | Astier | 361/683 |
| 6,034,874 A | * | 3/2000 | Watanabe | 361/704 |
| 6,471,533 B2 | * | 10/2002 | Lai et al. | 439/331 |

* cited by examiner

Primary Examiner—David Martin
Assistant Examiner—Hung Bui

(57) ABSTRACT

The present invention discloses an expansion card fixture for fixing the expansion card using in a network to a socket on a printed circuit board, which comprises a first plate, a second plate, a supporting member, at least one blocking plate and at least two side plates, where one end of the second plate connects to the bottom of the first plate, and thus the second plate directs to the first plate at an angle. The deformed structure constituted of the first plate and the second plate can recover to its original shape. One end of the supporting member connects to the middle of the first plate to support the expansion card. The blocking plate comprises an edge plate and a top hook, in which the edge plate whose bottom connects to the top of the first plate is perpendicular to the second plate to prevent longitudinal movement of the expansion card. The top hook formed at the top of the edge plate protrudes from the edge plate, heading for the bottom of the first is plate to prevent vertical movement of the expansion card. The two side plates individually connected to both sides of the first plate protrude upwards from the first plate to prevent transverse movement of the expansion card.

7 Claims, 6 Drawing Sheets

EXPANSION CARD FIXTURE

BACKGROUND OF THE INVENTION (A) Field of the Invention

The present invention is related to an expansion card fixture, more specifically, to an expansion card fixture for wireless data transmission.

(B) Description of Related Art

A wireless LAN (Local Area Network), instead of a wiring network, is widely used to internally transmit digital data in a company. Some buildings such as international airports, hotels and coffee shops are also constructing wireless LANs that provide communication services to customers. Users can utilize a personal computer or a PDA (personal Digital Assistant) having a wireless network card to link to the nearest access point. Therefore, in spite of e-mails, business status checking and internet games, the accesses and operations of network are without time-lag and distance. Gateways and routers in addition to access points are common wireless transmission apparatuses in a wireless LAN.

An expansion card is implemented as a peripheral of an apparatus such as a computer dictionary, PDA and the like. A PCMCIA (Personal Computer Memory Card International Association) card is widely used in a computer for linkage to a network. When a PCMCIA card is used for wireless transmission, EMI (Electromagnetic Interference) and environment testing problems become noticeable.

Traditionally, the fixing of a PCMCIA card of a wireless gateway is shown in FIG. 1(a): a conductive shielding gasket 13 is adhered to a PCB (Printed Circuit Board) 11, and then plastic tenons 14 are added to and covered by a metal structure 15. The conductive shielding gasket 13 is for grounding to prevent EMI occurring on the PCMCIA card used in a wireless gateway. The PCB 11 contains a socket 12 for insertion of one end of the PCMCIA card, and the metal structure 15 is for fixing the other end of the PCMCIA card. In FIG. 1(b), a PCMCIA card 16 is inserted between the socket 12 and the metal structure 15, and a sticker 17 is adhered to both the socket 12 and the PCMCIA card 16 afterwards to avoid their relative movement.

The above-mentioned fixing procedure of the PCMCIA card 16 has to sequentially set the conductive shielding gasket 13, the plastic tenons 14, and the metal structure 15, to insert the PCMCIA card 16 and to adhere a sticker 17. The procedure not only is complicated but takes more time, and is not convenient for on-line rework. As to reliability, the grounding performance of the conductive shielding gasket 13 is inconsistent and is unable to completely avoid EMI occurrence. Because the PCMCIA card 16 is not rigidly fixed in the metal structure 15, the worse grounding reliability often affects the environment testing performance. Furthermore, many components such as the conductive shielding gasket 13, the plastic tenons 14, the metal structure 15 and the sticker 17 are required, resulting in the puzzle to the management and purchase of such parts.

SUMMARY OF THE INVENTION

The object of the present invention is to provide an expansion card fixture for simplifying manufacturing process, enhancing reliability, diminishing the number of parts, and effectively avoiding EMI occurrence during wireless data transmission.

The expansion card of the present invention for fixing an expansion card to a PCB comprises a first plate, a second plate, a supporting member, at least one blocking plate and at least two side plates, where one end of the second plate connects to the bottom end of the first plate, and the second plate directs at an angle to the first plate. Therefore, the spring structure constituted of the first plate and the second plate can recover to the original shape. One end of the supporting member connects to the middle of the first plate to support the expansion card. The blocking plate comprises an edge plate and a top hook, the edge plate whose bottom connects to the top of the first plate being perpendicular to the second plate to prevent longitudinal movement of the expansion card. The top hook formed at the top of the edge plate protrudes from the edge plate and heads for the bottom of the first plate to prevent vertical movement of the expansion card. The two side plates individually connected to both sides of the first plate protrudes upwards from the first plate to prevent transverse movement of the expansion card.

The expansion card fixture can be fixed to a PCB by at least one fixing plug, a screw or by welding. The expansion card fixture can be formed by bending a metal plate, and thus the performance and reliability of grounding can be enhanced, i.e., EMI is decreased, by virtue of the flexibility of the metal plate.

DETAILED DESCRIPTION OF THE INVENTION

Figure 1A:
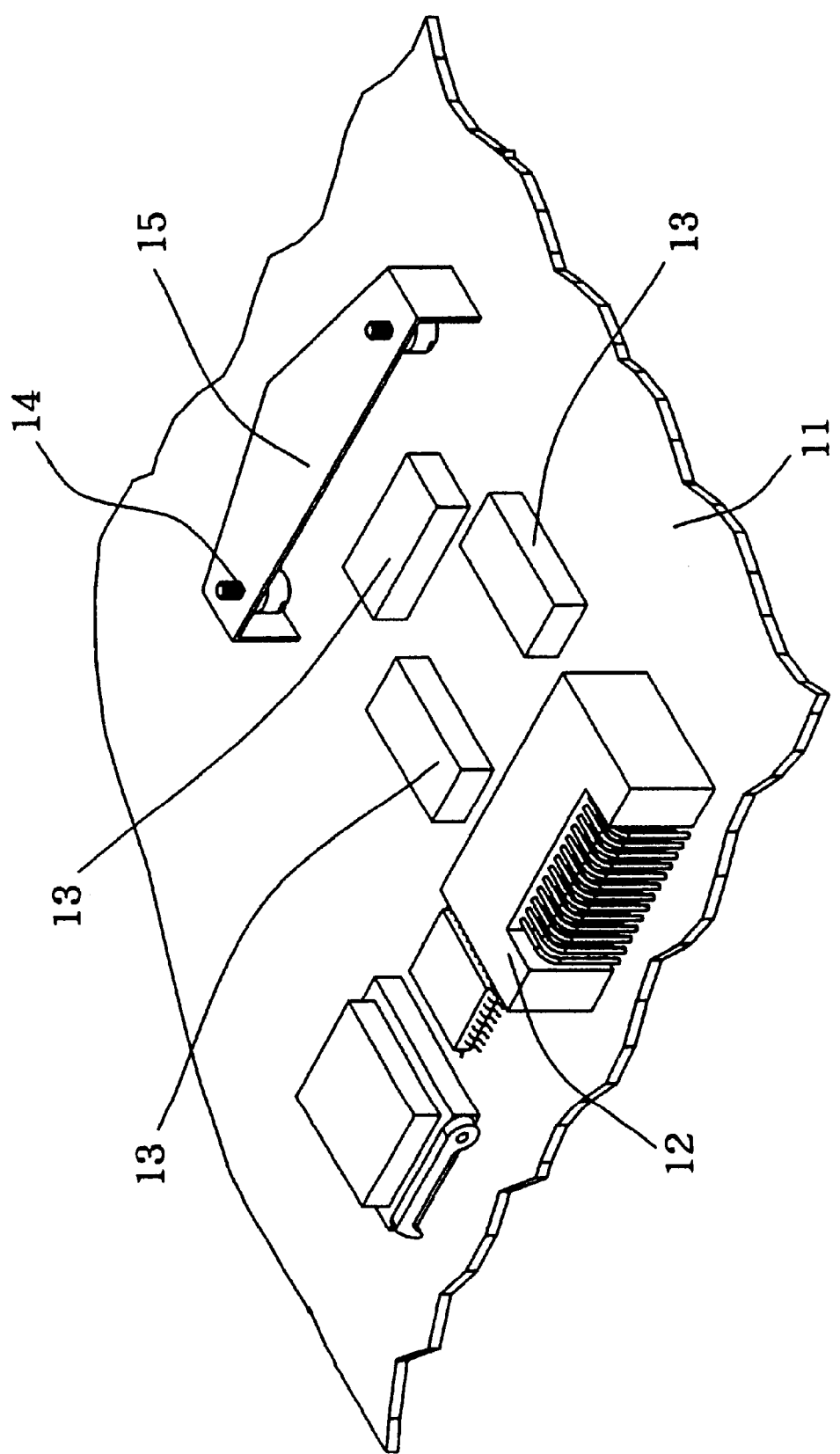
FIG. 1(a) and FIG. 1(b) illustrate a known fixing procedure of a PCMCIA card.
Figure 1B:
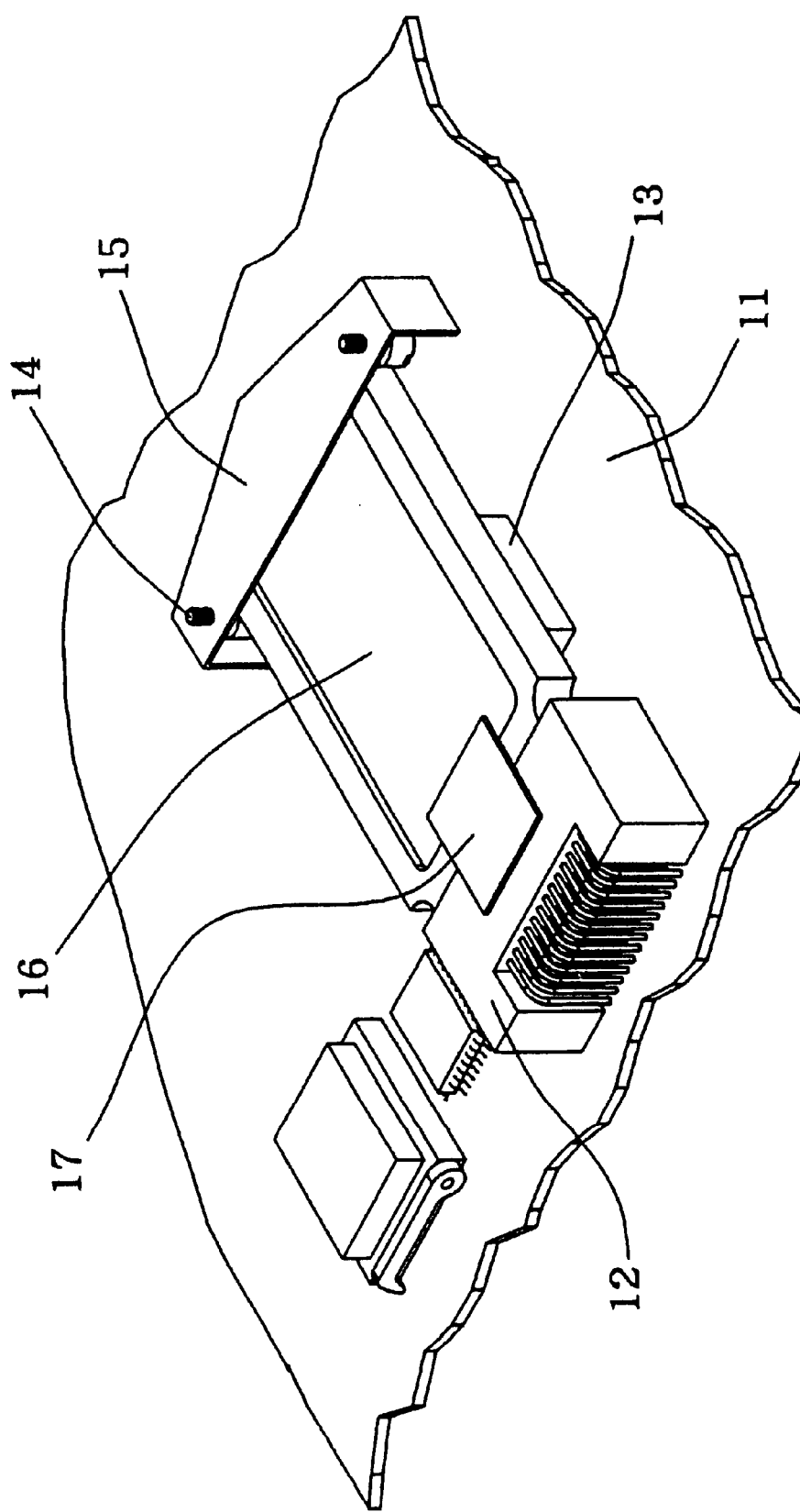
Figure 2A:
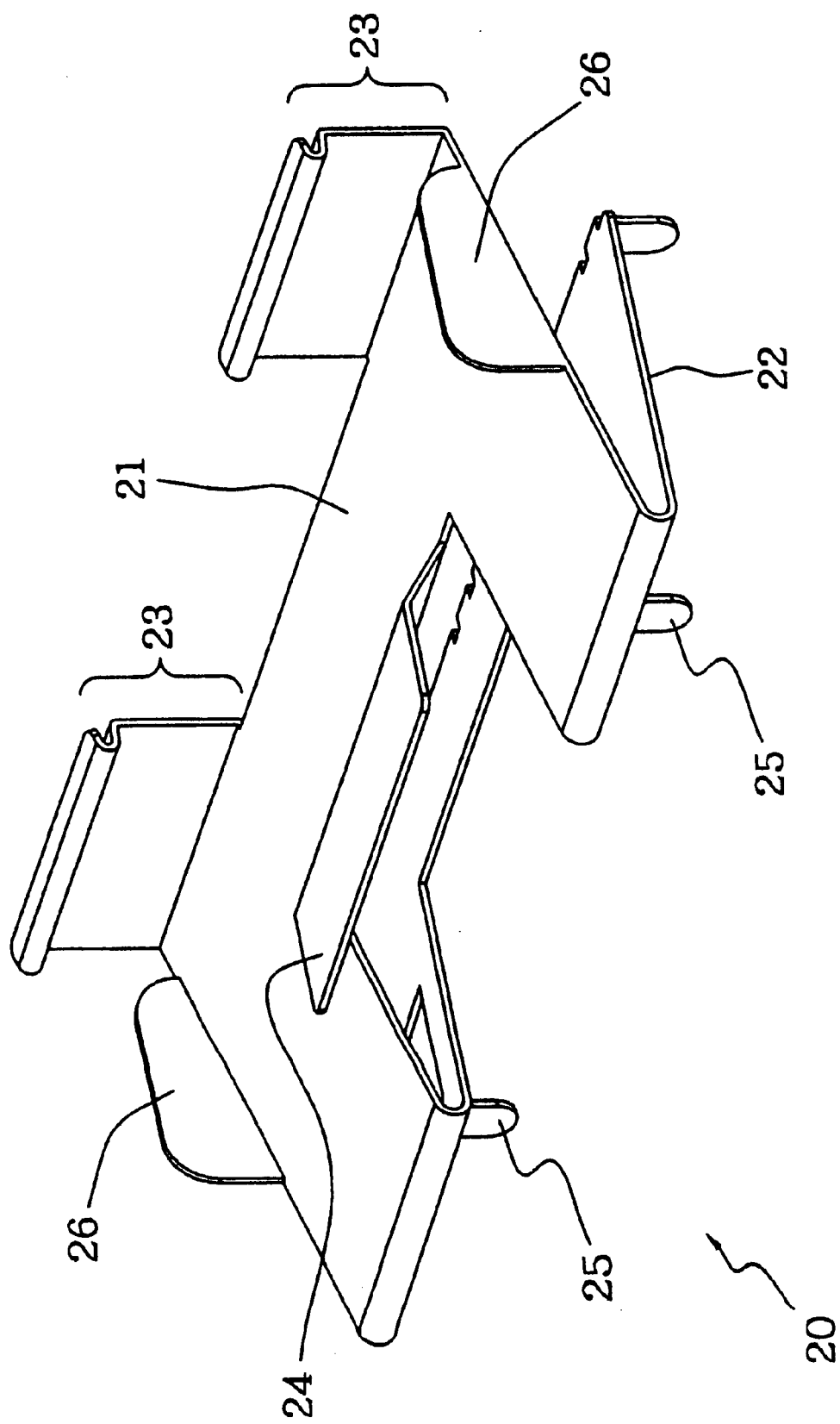
FIG. 2(a) to FIG. 2(e) illustrate a PCMCIA card fixture in accordance with the present invention.
Figure 2B:
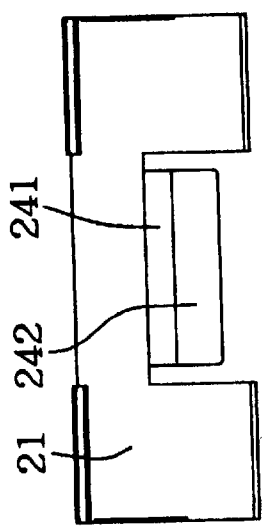
Figure 2D:
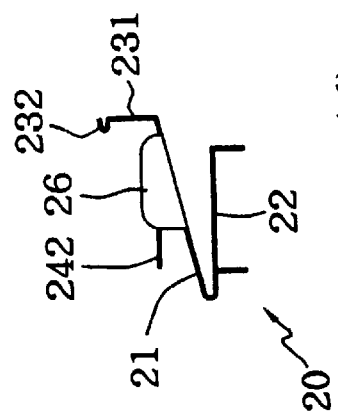
Figure 2C:
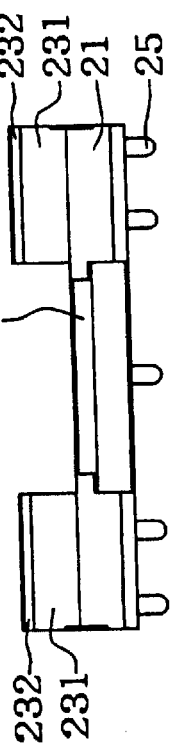

In FIG. 2(a), a PCMCIA card fixture 20 comprises a first plate 21, a second plate 22, two blocking plates 23, a supporting member 24, five fixing plugs 25 and two side plates 26. FIGS. 2(b), 2(c) and 2(d) respectively illustrate the top view, front view and side view of the PCMCIA card fixture 20. The first plate 21, one end of which connects to one end of the second plate 22, directs at an angle of 300 to the second plate 22. The supporting member 24 comprises a connecting plate 241 and a carrier plate 242, the connecting plate 241 being in connection with the first plate 21, the carrier plate 242 being used to contact and carry the PCMCIA card. The blocking plate 23 comprises an edge plate 231, which is perpendicular to the second plate 22, and a top hook 232 to prevent the longitudinal and vertical movements of the PCMCIA card. The blocking plate 23 and the carrier plate 242 of the supporting member 24 can clamp one end of the PCMCIA card. The side plates 26 vertically protrude from the first plate 22 to prevent the transverse movement of the PCMCIA card. Because the carrier plate 242 is parallel to the second plate 22, the carried PCMCIA card is parallel to the second plate 22 also.

Figure 2E:
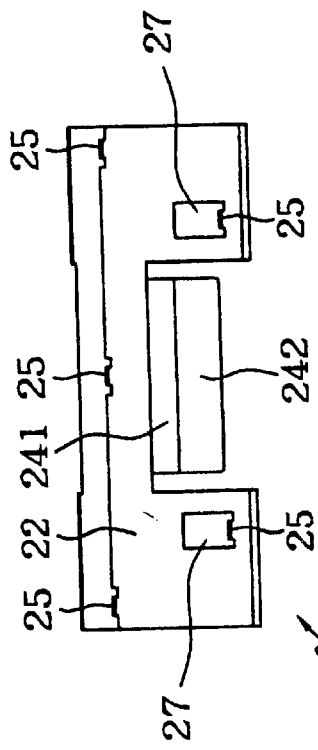

In FIG. 2(e), the bottom view of the PCMCIA card fixture 20, three of five fixing plugs 25 are placed on the end of the second plate 22, the other two are placed near to the connection portion of the second plate 22 and the first plate 21, and they are arranged in the form of a trapezoid. The fixing plugs 25 can be manufactured by bending the second plate 22, and thus two openings 27 are formed on the second plate 22. In reality, the first plate 21, the second plate 22, the blocking plate 23, the supporting member 24 20 and the side plates 26 can be made by cutting and bending a single metal plate.

Figure 3:
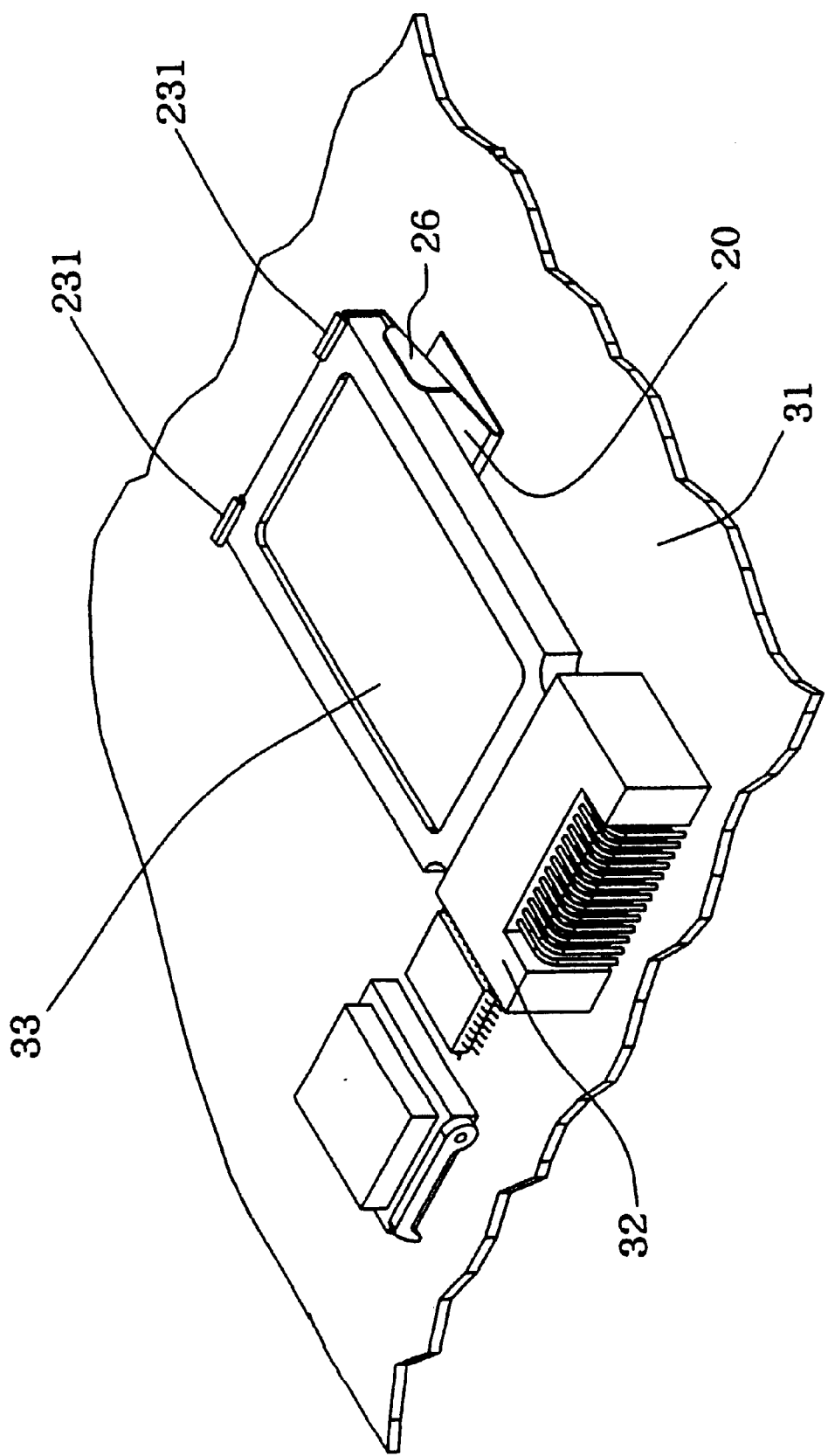
FIG. 3 illustrates an application of the PCMCIA card fixture in accordance with the present invention.

In FIG. 3, the PCMCIA card fixture 20 is soldered by five fixing plugs 25 onto a PCB 31. Sequentially, one end of a PCMCIA card 33 is inserted into a socket 32, and the other end of that is embedded into the PCMCIA card fixture 20. The PCMCIA card can be confined between the socket 32 and the blocking plate 23 in the longitudinal direction, and confined between the side plates 26 in the transverse direction to ensure the PCMCIA card 33 is parallel to the PCB 31.

The PCMCIA card can be made of metal, e.g., a tinplate. Because metal plate is flexible after being bent, the deformed metal plate is capable of recovering to the original shape. Therefore, the PCMCIA card fixture 20 of the embodiment can tightly grasp the PCMCIA card 33 to ascertain the contact reliability and thus to improve grounding performance. The PCMCIA card 20 can reduce EMI and pass the environment testing, and simplify the traditional process using a conductive shielding gasket.

Figure 4:
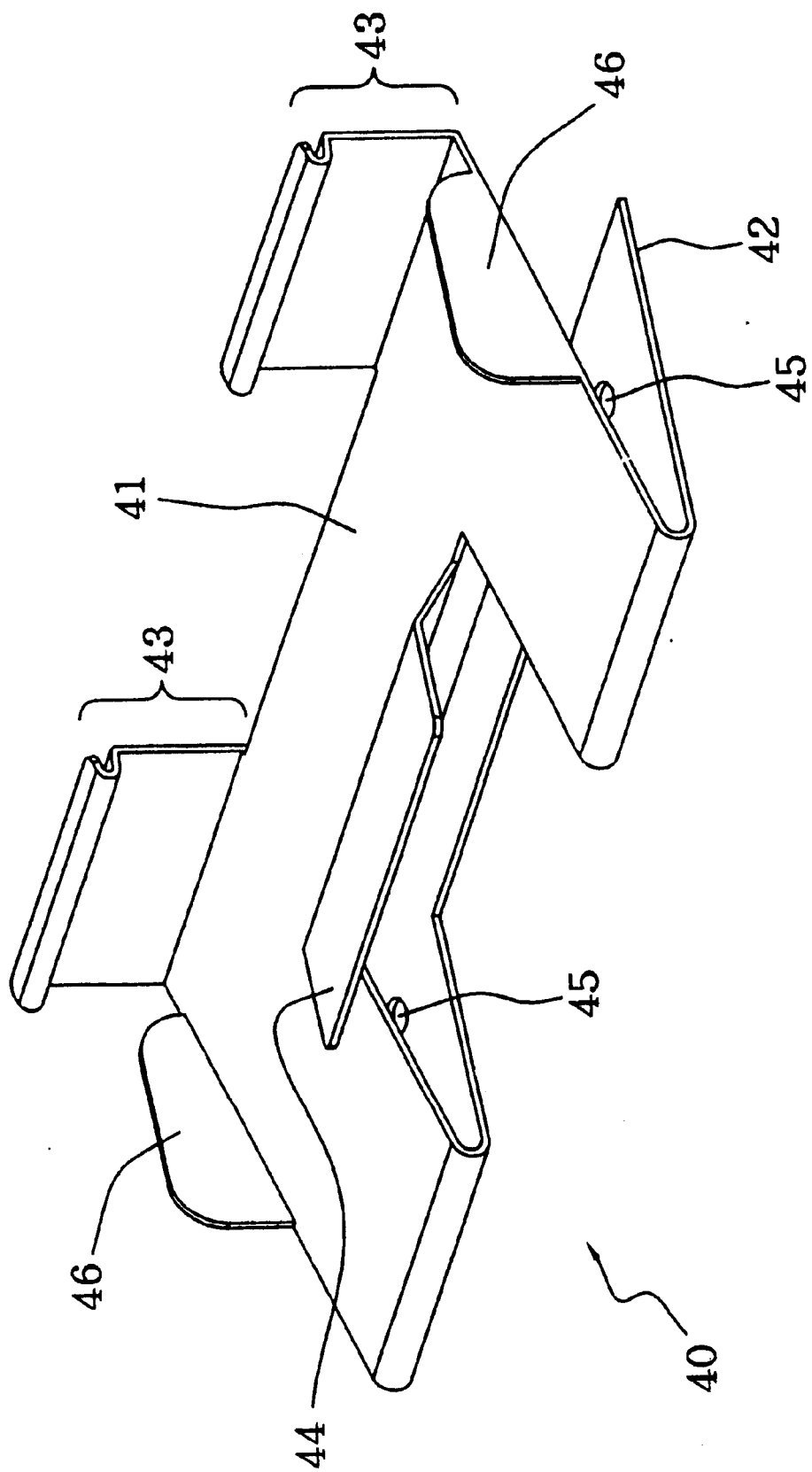
FIG. 4 illustrates another PCMCIA card fixture in accordance with the present invention.

FIG. 4 illustrates another PCMCIA card fixture 40 of the present invention, which is slightly modified based on the PCMCIA card fixture 20. The PCMCIA card fixture 40 comprises a first plate 41, a second plate 42, two blocking plates 43, a supporting member 44 and two side plates 46, in which the PCMCIA card 40 is fixed by two screws, and the second plate 42 has two screw holes 45.

The PCMCIA card fixture 20 and 40 can be designed to be all-in-one, i.e., combining the functions of grounding and fixing, and made by cutting and bending a metal plate. Thus, the loading of the managements of parts and stock can be decreased.

In order to clearly differentiate the present invention and the prior art, the above mentioned embodiments all employ a PCMCIA card as an example. Certainly, other expansion cards can also be utilized based on the spirit of the present invention, and thus is covered by the present invention.

The above-described embodiment of the present invention are intended to be illustratively only. Numerous alternative embodiments may be devised by those skilled in the art without departing from the scope of the following claims.

What is claimed is:

1. An expansion card fixture for fixing a expansion card to a socket on a printed circuit board, the expansion card fixture comprising:

a first plate;

a second plate being fixed on the printed circuit board and corresponding to the socket, one end of the second plate being connected to the bottom of the first plate, and the second plate to the first plate residing at an angle;

a supporting member having one end connected to the middle of the first plate for supporting the expansion card;

at least one blocking plate, including:

an edge plate whose bottom is connected to the top of the first plate and is perpendicular to the second plate for preventing a longitudinal movement of the expansion card; and a top hook, connected to the top of the edge plate and protruding outwards the edge plate in a direction of facing the bottom of the first plate, for preventing a vertical movement of the expansion card; and at least two side plates, individually connected to both sides of the first plate and protruding upwards the first plate, for preventing a transverse movement of the expansion card.

2. The expansion card fixture of claim 1, further comprising at least one fixing plug for fixing to the printed circuit board.

3. The expansion card fixture of claim 2, wherein the fixing plug is formed by bending the second plate.

4. The expansion card fixture of claim 2, wherein the number of the fixing plugs is five and the fixing plugs are arranged in a trapezoid form.

5. The expansion card fixture of claim 1, wherein the second plate comprises at least one screw hole for fixing to the printed circuit board.

6. The expansion card fixture of claim 1, wherein the angle between the first plate and the second plate is smaller than 45°, and the structure is capable of recovering to its original shape after a deformation.

7. The expansion card fixture of claim 1, wherein the supporting member comprises:

a connecting plate connected to the first plate; and a carrier plate, connected to the connecting plate, for carrying the expansion card.

* * * * *